United States Patent

Yuan et al.

(10) Patent No.: US 10,141,072 B2
(45) Date of Patent: Nov. 27, 2018

(54) EFFICIENT ENCODER BASED ON MODIFIED RU ALGORITHM

(71) Applicant: SK hynix Inc., Gyeonggi-do OT (KR)

(72) Inventors: Wei-Hao Yuan, San Jose, CA (US); Chung-Li Wang, Fremont, CA (US); Johnson Yen, Fremont, CA (US)

(73) Assignee: SK Hynix Inc., Gyeonggi-do (KR)

( * ) Notice: Subject to any disclaimer, the term of this patent is extended or adjusted under 35 U.S.C. 154(b) by 25 days.

(21) Appl. No.: 15/181,105

(22) Filed: Jun. 13, 2016

(65) Prior Publication Data

US 2016/0364292 A1    Dec. 15, 2016

Related U.S. Application Data

(60) Provisional application No. 62/174,434, filed on Jun. 11, 2015.

(51) Int. Cl.
| | |
|---|---|
| *G11C 29/52* | (2006.01) |
| *H03M 13/11* | (2006.01) |
| *H03M 13/00* | (2006.01) |
| *G11C 29/04* | (2006.01) |

(52) U.S. Cl.
CPC ........... *G11C 29/52* (2013.01); *H03M 13/116* (2013.01); *H03M 13/118* (2013.01); *H03M 13/1148* (2013.01); *H03M 13/611* (2013.01); *G11C 2029/0411* (2013.01)

(58) Field of Classification Search
CPC ....................................................... G06F 11/10
USPC ......................................... 714/801, 804, 806
See application file for complete search history.

(56) References Cited

U.S. PATENT DOCUMENTS

| | | | | |
|---|---|---|---|---|
| 3,810,101 | A * | 5/1974 | Avery ..................... | G06F 13/22 710/110 |
| 3,909,799 | A * | 9/1975 | Recks ..................... | G06F 9/262 710/5 |
| 4,047,158 | A * | 9/1977 | Jennings ................. | G06F 3/153 358/1.11 |
| 4,213,201 | A * | 7/1980 | Gagnier ............. | H04Q 11/0407 370/220 |
| 8,762,823 | B2 * | 6/2014 | Yang ................... | G11C 11/5628 714/792 |
| 8,954,816 | B2 * | 2/2015 | Hassan ............... | G06F 11/1048 714/752 |
| 2009/0183047 | A1 | 7/2009 | Lampe et al. | |
| 2013/0024747 | A1 * | 1/2013 | Sharon ................ | G06F 11/1072 714/773 |
| 2013/0290773 | A1 * | 10/2013 | Yoshihara ........... | G06F 12/0246 714/6.21 |

(Continued)

OTHER PUBLICATIONS

Thomas J. Richardson et al., Efficient Encoding of Low-Density Parity Check Codes, IEEE Transaction on information theory, Feb. 2001, p. 638-656, vol. 47, No. 2.

(Continued)

*Primary Examiner* — Fritz Alphonse
(74) *Attorney, Agent, or Firm* — IP & T Group LLP

(57) ABSTRACT

Memory systems may include a memory portion, and a controller suitable for receiving information data, generating first stage data, generating a first portion parity information, generating a second portion parity information based at least in part on the first portion parity information and the first stage data, and outputting the second portion parity information.

15 Claims, 8 Drawing Sheets

(56) References Cited

U.S. PATENT DOCUMENTS

2014/0281790 A1 9/2014 Li et al.
2016/0103621 A1* 4/2016 Park .................. G06F 12/0875
                                                    711/103

OTHER PUBLICATIONS

M.P.C. Fossorier, Quasicuclic low-density parity-check codes from circulant permutation matrices, IEEE Transaction on information theory, Aug. 2004, p. 1788-1793, vol. 50, No. 2.

* cited by examiner

50

70

80

EFFICIENT ENCODER BASED ON MODIFIED RU ALGORITHM

CROSS-REFERENCE TO RELATED APPLICATIONS

This application claims the benefit of U.S. Provisional Application No. 62/174,434 filed Jun. 11, 2015, the entire contents of which are incorporated herein by reference.

BACKGROUND

1. Field

Exemplary embodiments of the present disclosure relate to a memory system and an operating method thereof.

2. Description of the Related Art

The computer environment paradigm has shifted to ubiquitous computing systems that can be used anytime and anywhere. Due to this fact, the use of portable electronic devices such as mobile phones, digital cameras, and notebook computers has rapidly increased. These portable electronic devices generally use a memory system having memory devices, that is, a data storage device. The data storage device is used as a main memory device or an auxiliary memory device of the portable electronic devices.

Data storage devices using memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

Correction codes are used for better performance and extension of lifetime of the memory device. There is a need for improved coding mechanisms to improve memory performance and longevity.

SUMMARY

Aspects of the invention include memory systems. The memory systems may include a memory portion, and a controller suitable for receiving information data, generating first stage data, generating a first portion parity information, generating a second portion parity information based at least in part on the first portion parity information and the first stage data, and outputting the second portion parity information.

Further aspects of the invention include methods. The methods may include receiving, with a controller, information data, generating, with the controller, first stage data, generating, with the controller, a first portion parity information, generating, with the controller, a second portion parity information based at least in part on the first portion parity information and the first stage data, and outputting the second portion parity information.

Additional aspects of the invention include memory devices. The memory devices may include a memory portion, and a controller configured to, receive information data, generate first stage data, generate a first portion parity information, generate a second portion parity information based at least in part on the first portion parity information and the first stage data, and output the second portion parity information.

DETAILED DESCRIPTION

Figure 1:
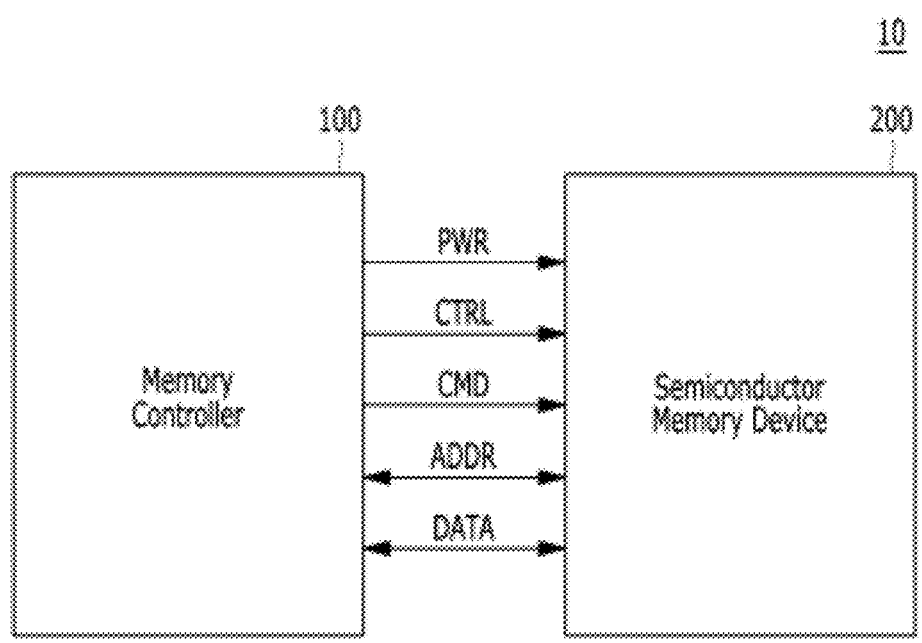
FIG. 1 is a block diagram schematically illustrating a memory system in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The invention can be implemented numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take may be referred to as techniques. In general, the order of the steps of disclosed processes may be altered within the scope of the invention. Unless stated otherwise, a component such as a processor or a memory described as being suitable for performing a task may be implemented as a general component that is temporarily suitable for performing the task at a given time or a specific component that is manufactured to perform the task. As used herein, the term 'processor' refers to one or more devices, circuits, and/or processing cores suitable for processing data, such computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

FIG. 1 is a block diagram schematically illustrating a memory system 10 in accordance with an embodiment of the present invention.

Referring FIG. the memory system 10 may include a memory controller 100 and a semiconductor memory device 200.

The memory controller 100 may control overall operations of the semiconductor memory device 200.

The semiconductor memory device 200 may perform one or more erase, program and read operations under the control of the memory controller 100. The semiconductor memory device 200 may receive a command CMD an address ADDR and data DATA through input/output lines. The semiconductor memory device 200 may receive power PWR through a power line and a control signal CTRL through a control line. The control signal may include a command latch enable (CLE) signal, an address latch enable (ALE) signal, a chip enable (CE) signal, a write enable (WE) signal, a read enable (RE) signal and so on.

The memory controller 100 and the semiconductor memory device 200 may be integrated in a single semiconductor device. For example, the memory controller 100 and the semiconductor memory device 200 may be integrated in a single semiconductor device such as a solid state drive (SSD). The solid state drive may include a storage device for storing data therein. When the semiconductor memory system 10 is used in an SSD, operation speed of a host (not shown) coupled to the memory system 10 may remarkably improve.

The memory controller 100 and the semiconductor memory device 200 may be integrated in a single semiconductor device such as a memory card. For example, the memory controller 100 and the semiconductor memory device 200 may be integrated in a single semiconductor device to configure a memory card such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro) a secure digital (SD) card, a mini secure digital (miniSD) card, a micro secure digital (microSD) card, a secure digital high capacity (SDHC), and a universal flash storage (UFS).

For another example, the memory system 10 may be provided as one of various elements including an electronic device such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP) a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, a radio-frequency identification (RFID) device, or elements devices of a computing system.

Figure 2:
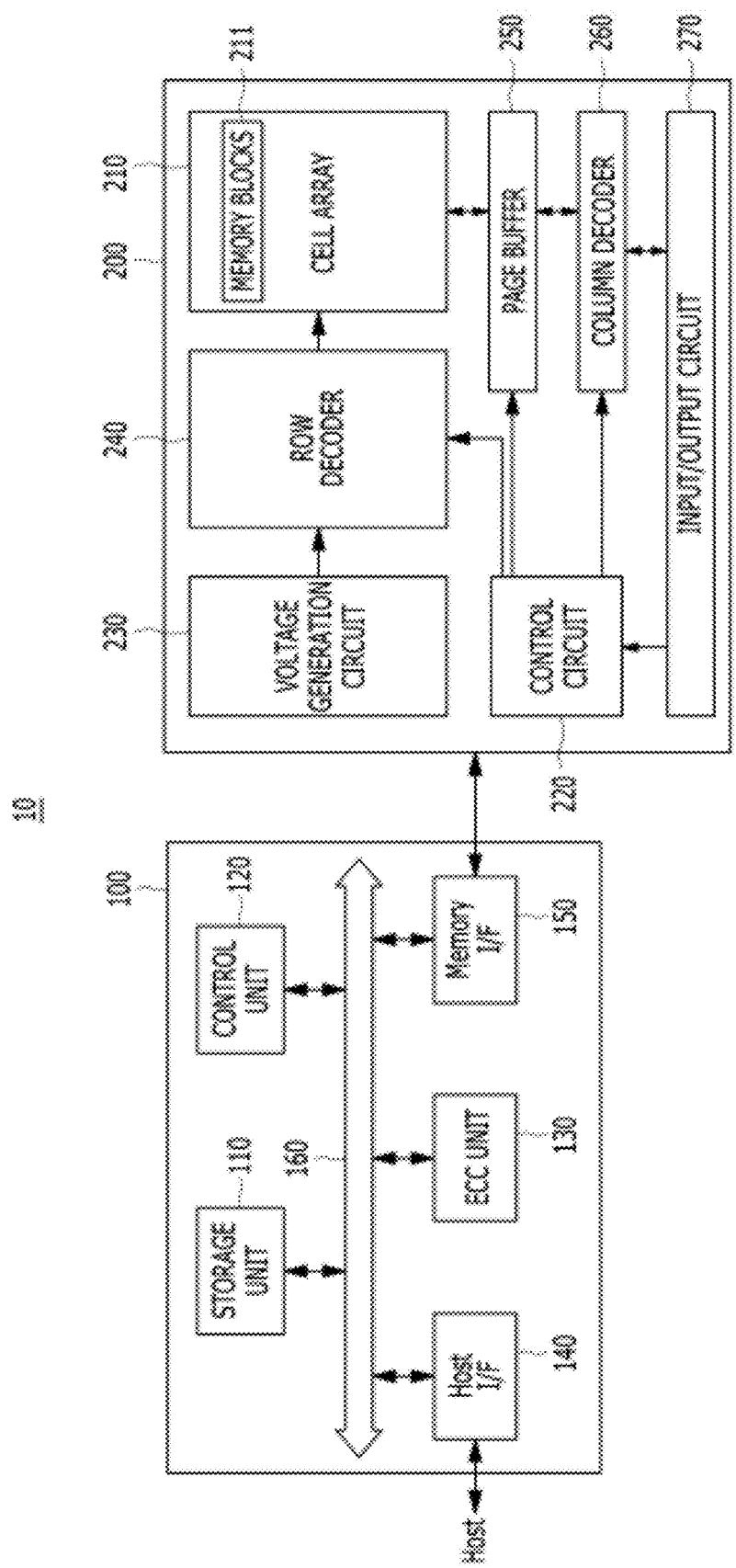
FIG. 2 is a block diagram illustrating a memory system in accordance with an embodiment of the present invention.

FIG. 2 is a detailed block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device, and in particular, store data to be accessed by the host device.

The host device may be implemented with any one of various kinds of electronic devices. In some embodiments the host device may include an electronic device such as a desktop computer, a workstation, a three-dimensional (3D) television, a smart television, a digital audio recorder, a digital audio player, a digital picture recorder, a digital picture player, a digital video recorder and a digital video player. In some embodiments, the host device may include a portable electronic device such as a mobile phone, a smart phone, an e-book, an MP3 player, a portable multimedia player (PMP), and a portable game player.

The memo device 200 may store data to be accessed by the host device.

The memory device 200 may be implemented with a volatile memory device such as a dynamic random access memory (DRAM) and a static random access memory (SRAM) or a non-volatile memory device such as a read only memory (ROM), a mask ROM (MROM), a programmable ROM (PROM) an erasable programmable ROM (EPROM), an electrically erasable programmable ROM (EEPROM), a ferroelectric random access memory (FRAM), a phase change RAM (PRAM), a magnetoresistive RAM (MRAM) and a resistive RAM (RRAM).

The controller 100 may control storage of data in the memory device 200. For example, the controller 100 may control the memory device 200 in response to a request from the host device. The controller 100 may provide the data read from the memory device 200, to the host device and store the data provided from the host device into the memory device 200.

The controller 100 may include a storage unit 110, a control unit 120, the error correction code (EEC) unit 130, a host interface 140 and a memory interface 150, which are coupled through a bus 160.

The storage unit 110 may serve as a working memory of the memory system 10 and the controller 100, and store data for driving the memory system 10 and the controller 100. When the controller 100 controls operations of the memory device 200, the storage unit 110 may store data used by the controller 100 and the memory device 200 for such operations as read, write, program and erase operations.

The storage unit 110 may be implemented with a volatile memory. The storage unit 110 may be implemented with a static random access memory (SRAM) or a dynamic random access memory (DRAM). As described above, the storage unit 110 may store data used by the host device in the memory device 200 for the read and write operations. To store the data, the storage unit 110 may include a program memory, a data memory, a write buffer, a read buffer, a map buffer, and so forth.

The control unit 120 may control general operations of the memory system 10, and a write operation or a read operation for the memory device 200, in response to a write request or a read request from the host device. The control unit 120 may drive firmware, which is referred to as a flash translation layer (FTL), to control the general operations of the memory system 10. For example, the FTL may perform operations such as logical to physical (L2P) mapping, wear leveling, garbage collection, and bad block handling. The L2P mapping is known as logical block addressing (LBA).

The ECC unit 130 may detect and correct errors in the data read from the memory device 200 during the read operation. The ECC unit 130 may not correct error bits when the number of the error bits is greater than or equal to a threshold number of correctable error bits, and may output an error correction fail signal indicating failure in correcting the error bits.

In some embodiments, the ECC unit 130 may perform an error correction operation based on a coded modulation such as a low density parity check (LPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), a Block coded modulation (BCM), and so on. The ECC unit 130 may include all circuits, systems or devices for the error correction operation.

The host interface 140 may communicate with the host device through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the CPU 120. When the memory device 200 is a flash memory such as a NAND flash memory, the memory interface 150 may generate control signals for the memory and process data under the control of the CPU 120.

The memory device 200 may include a memory cell array 210, a control circuit 220, a voltage generation circuit 230, a row decoder 240, a page buffer 250, a column decoder 260, and an input/output circuit 270. The memory cell array 210 may include a plurality of memory blocks 211 and may store data therein. The voltage generation circuit 230, the row decoder 240, the page buffer 250, the column decoder 260 and the input/output circuit 270 form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages having various levels. For example, in an erase operation, the voltage generation circuit 230 may generate operation voltages having various levels such as an erase voltage and a pass voltage.

The row decoder 240 may be connected to the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks among the plurality of memory blocks 211.

The page buffer 250 is connected to the memory cell array 210 through bit lines BL (not shown). The page buffer 250 may precharge the bit lines BL with a positive voltage, transmit/receive data to/from a selected memory block in program and read operations, or temporarily store transmitted data, in response to a page buffer control signal generated by the control circuit 220.

The column decoder 260 may transmit/receive data to/from the page buffer 250 or transmit/receive data to/from the input/output circuit 270.

The input/output circuit 270 may transmit, to the control circuit 220, a command and an address, transmitted from an external device (e.g., the memory controller 100), transmit data from the external device to the column decoder 260, or output data from the column decoder 260 to the external device, through the input/output circuit 270.

The control circuit 220 may control the peripheral circuit in response to the command and the address.

Figure 3:
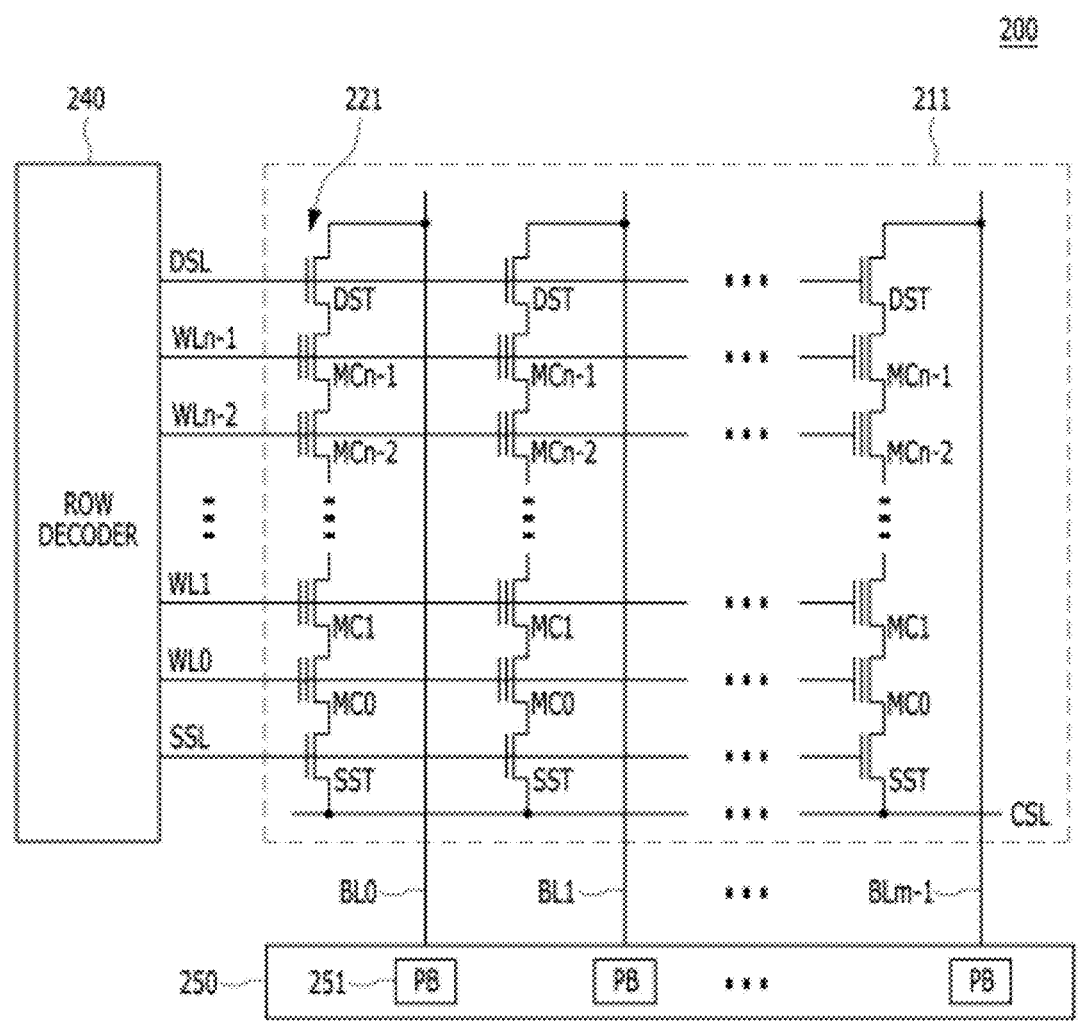
FIG. 3 is a circuit diagram illustrating a memory block of a memory device in accordance with an embodiment of the present invention.

FIG. 3 is a circuit diagram illustrating a memory block of a semiconductor memory device in accordance with an embodiment of the present invention. For example, a memory block of FIG. 3 may be the memory blocks 211 of the memory cell array 200 shown in FIG. 2.

Referring to FIG. 3, the memory blocks 211 may include a plurality of cell strings 221 coupled to bit lines BL0 to BLm−1, respectively. The cell string of each column may include one or more drain selection transistors DST and one or more source selection transistors SST. A plurality of memory cells or memory cell transistors may be serially coupled between the selection transistors DST and SST. Each of the memory cells MC0 to MCn−1 may be formed of a multi-level cell (MLC) storing data information of multiple bits in each cell. The cell strings 221 may be electrically coupled to the corresponding bit lines BL0 to BLm−1, respectively.

In some embodiments, the memory blocks 211 may include a NAND-type flash memory cell. However, the memory blocks 211 are not limited to the NAND flash memory, but may include NOR-type flash memory, hybrid flash memory in which two or more types of memory cells are combined, and one-NAND flash memory in which a controller is embedded inside a memory chip.

Figure 4:
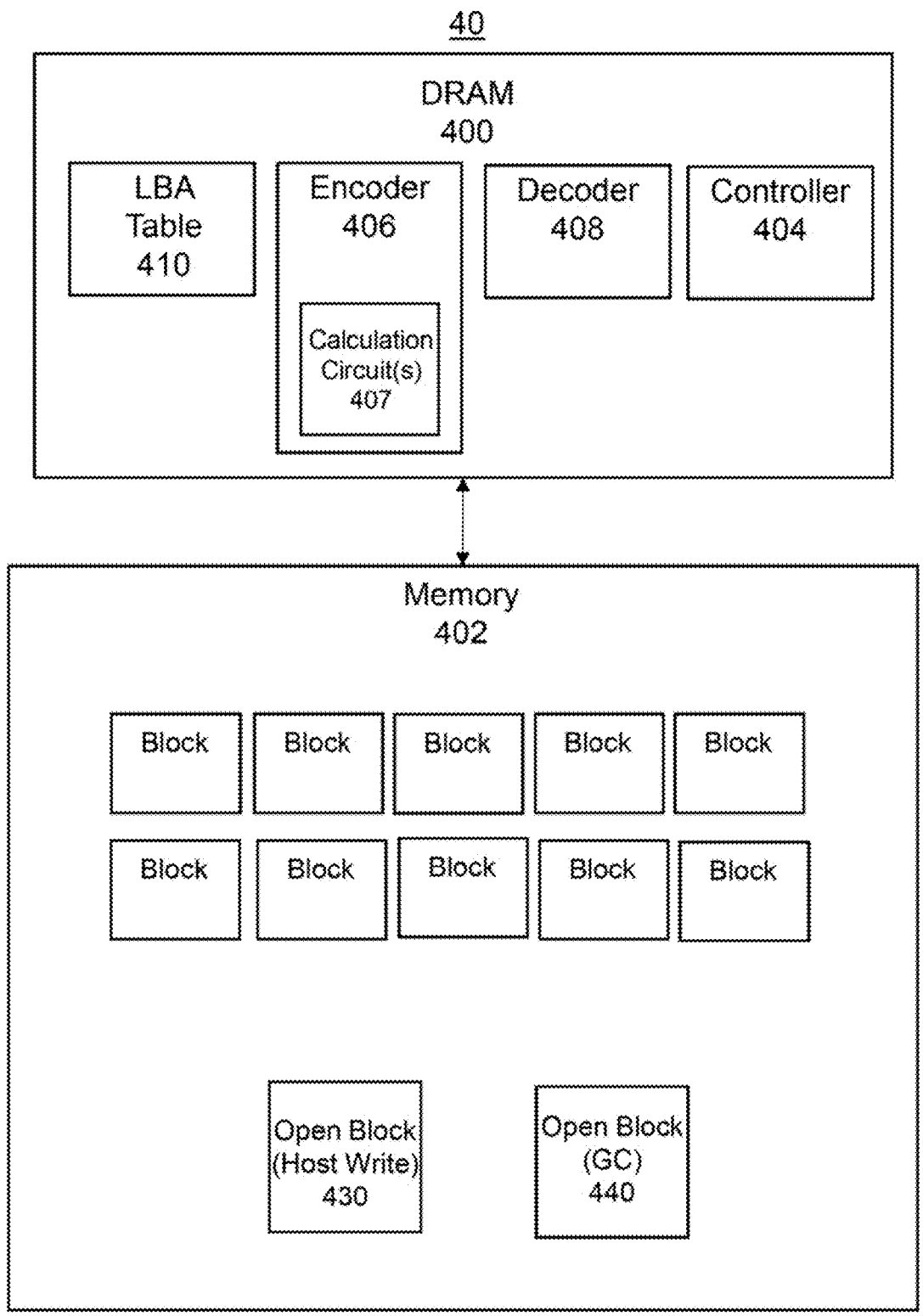
FIG. 4 is a diagram of an example system according to aspects of the invention.

FIG. 4 is a diagram of an example system 40 according to aspects of the invention. The memory system 40 may include a DRAM portion 400 and a memory portion 402. The DRAM portion 400 may be a volatile memory. The DRAM portion 400 may include a controller 404, an LBA table 410, an encoder 406, and a decoder 408. The decoder 408 and encoder 406 may be incorporated as part of the controller 404. The encoder 406 may include a plurality of calculation circuits 407, such as a sparse circulant calculation circuit, a dense calculation circuit, etc. The memory 402 may include a plurality of memory blocks, an open block for host writes 430, and an open block for garbage collection 440.

In flash memory systems, Error Correction Codes (ECC) play an important role, LDPC (Low Density Parity Check) is widely used for better ECC performance and to extend the life time of storage devices. However, the calculations performed in LDPC encoding is complex and requires high power consumption. Thus, as disclosed herein, efficient hardware architecture for encoding Quasi-Cyclic LDPC codes are shown to reduce calculation logic. Moreover, a modified RU (recently used) algorithm is also applied to further reduce the complicated calculations to improve the energy efficiency.

In the formula below, the way typical encoders work to generate parity information can be seen, where H is the parity check matrix, c is the input code-word and p is the parity information.

$$H*c^t=[H1H2]*[u^t;p^t]=0.$$

$$H1*u^t+H2*p^t=0.$$

$$H1*u^t=H2*p^t$$

$$p^t=(H2)^{-1}*H1^t*u^t=G*H1*u^t$$

To systematically generate the parity information, the parity check matrix is divided into two matrices, H1 and H2. Both of them are circulant constructed sparse matrices, thus, the calculation is simplified and power-efficient. However, in the last step H1 needs to do inverse transfer to generate G matrix, which is a dense matrix and consumes a lot of the power in hardware.

Figure 5:
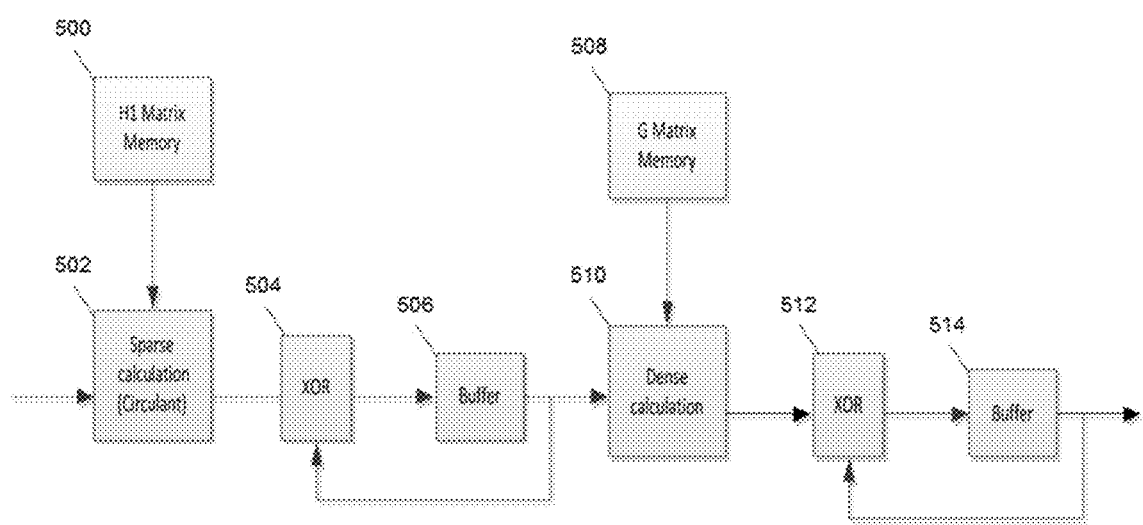
FIG. 5 is a diagram of steps in a method according to aspects of the invention.
Figure 6:
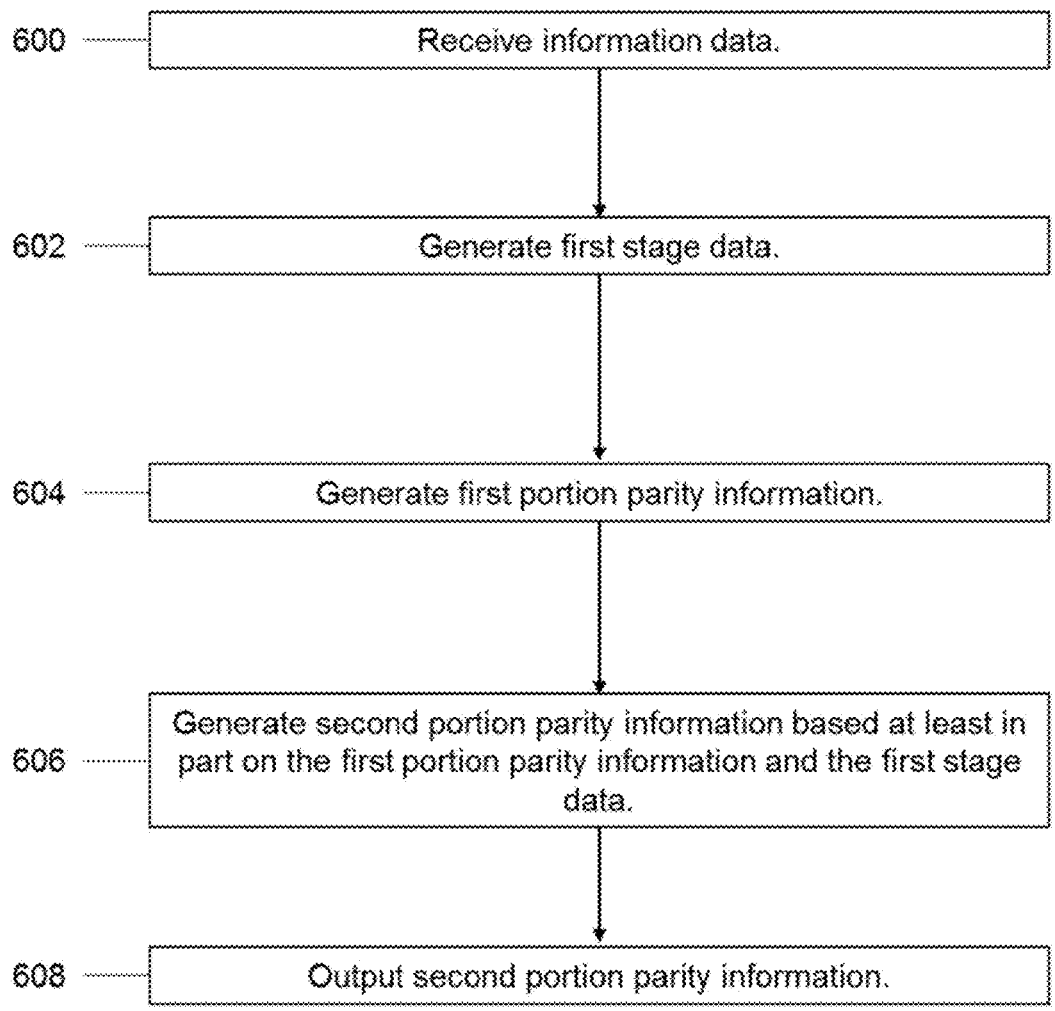
FIG. 6 is a flowchart of steps in a method for encoding data in accordance with aspects of the invention.

This architecture is shown in the diagram 50 of FIG. 5. Information data is received and the sparse calculation 502 is performed with the H1 matrix 500. Next, an XOR parity 504 is performed on the sparse calculation and then stored in a buffer 506. Then, the dense calculation 510 is performed on the XOR parity stored in the buffer with the G matrix 508. Then, an XOR parity 514 is performed on the dense calculation and stored in a buffer 514. Hence, how to minimize the size of dense matrix (e.g., dense matrix calculation 510 with matrix G) is crucial to improve the power efficacy of encoder.

The invention disclosed herein will be described with reference to FIGS. 6-9. At FIG. 6, a flowchart 60 of steps for encoding data is shown. At FIG. 7, an example of a matrix partitioning 70 is shown. At FIG. 8, a diagram 80 of steps in a method for encoding data is shown. At FIG. 9, a flowchart 90 of steps for encoding data is shown. The invention as disclosed herein may be performed by a controller, such as those described above, and/or by an encoder as part of or implemented separately from the controller, as described above.

Figure 7:
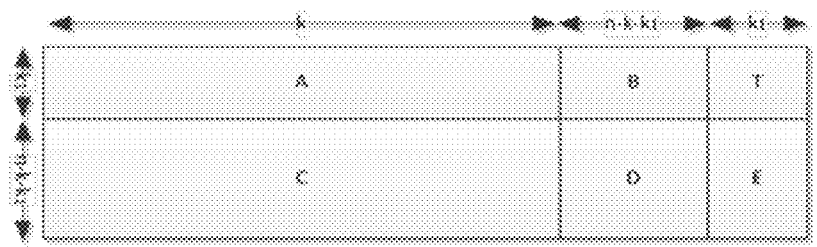
FIG. 7 is a diagram of an example parity check matrix according to aspects of the invention.

At step 600, information data is received. The encoding process may be divided into two stages, a first stage and a second stage. At step 602, first stage data is generated. To further minimize the size of dense matrix, an RU algorithm combined with a group structure is disclosed herein. According to an RU algorithm, the parity check matrix (e.g., matrix 70) is divided into 6 portions (A, B, T, C, D, and E as shown in FIG. 7) and the T portion may be arranged as a lower triangle matrix to reduce the size of the dense matrix.

Parity information can be divided into two parts which can be generated with different two steps which indicated in equation (1) and (2) below.

$H*c^t = [ABT]$;

$[CDE]*[u^t P1^t P2^t] = 0$;

$$P1^t = (ET^{-1}B+D)^{-1} * (ET^{-1}A+C) * u^t \qquad (1);$$

$$P2^t = T^{-1} * (A*u^t + B*P1^t) \qquad (2);$$

$$P1^t = F*(E*A+C)*u^t \qquad (3);$$

$$P2^t = (A*u^t + B*P1^t) \qquad (4);$$

When information data (u) comes in (step 600), an encoder may generate a first portion parity information (P1) at step 604. Advantageously, step 604 is the only step to include a calculation using the dense matrix. Once P1 information is generated, at step 606, the encoder may generate a second portion parity information (P2) based at least in part on the first portion parity information and the first stage data. For example, the encoder may apply the first portion parity information to a second portion sparse matric calculation and generate second portion parity data (P2) with the generated first stage data. At step 608, the second portion parity information is outputted.

Moreover, with proper circulant permutation, the T portion can be an identical matrix which would not only simplify the complex calculation but also reduce the necessary memory space which indicated in equation (3) and (4) above. After the permutation the encoder only needs 5 memory spaces to store the parity check matrix information while dense matrix F can be calculated and achieved in advance with $(ET^{-1}B+D)^{-1}$. Since the dense matrix F is minimized and parity calculation is also simplified, this invention may reduce around 35% dynamic power than the traditional implementation.

Figure 8:
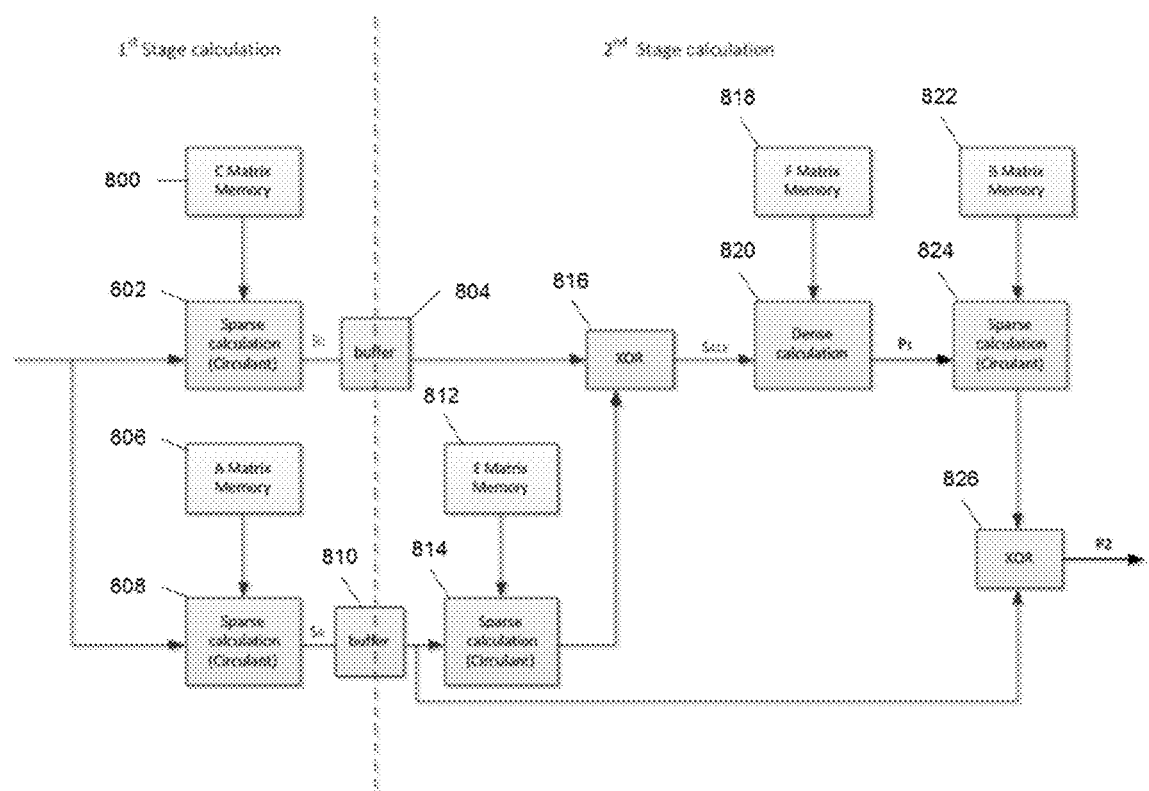
FIG. 8 is a diagram of steps in a method for encoding data according to aspects of the invention.
Figure 9:
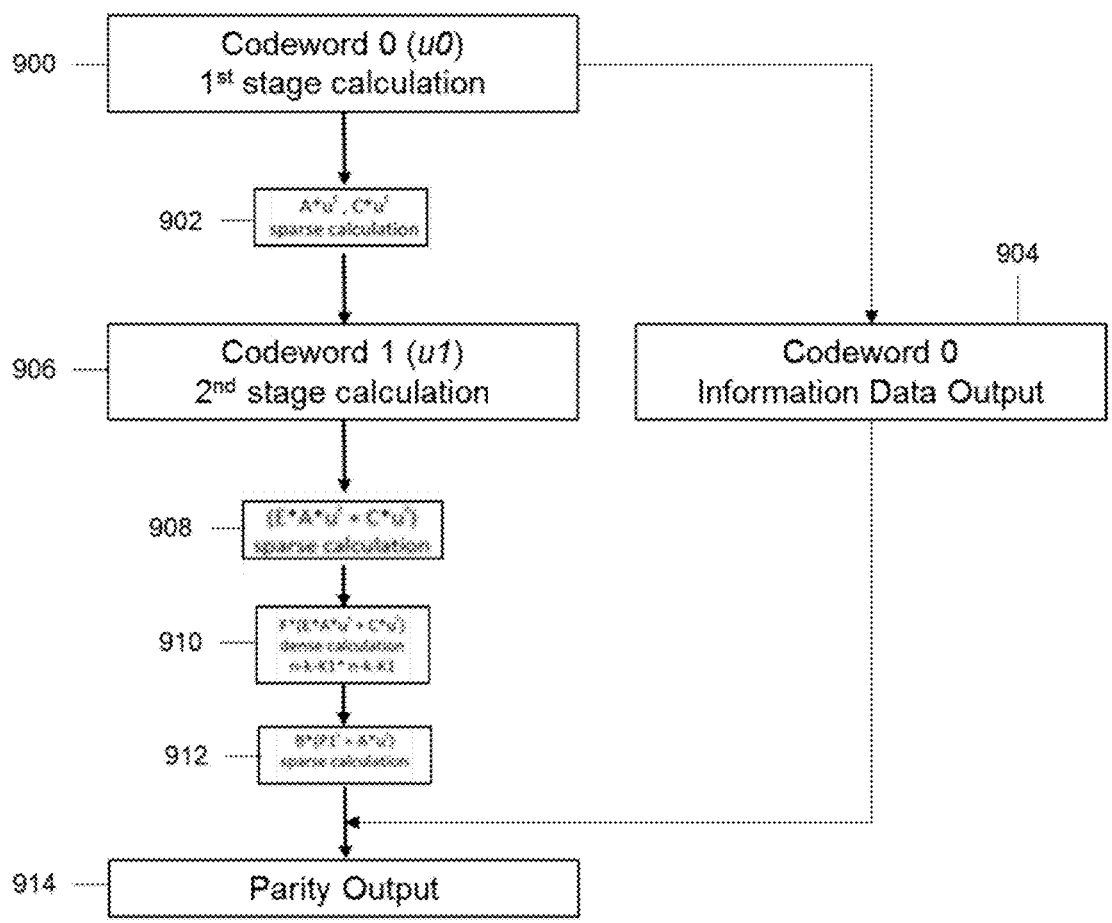
FIG. 9 is a flowchart of steps in a method for encoding data in accordance with aspects of the invention.

A detailed example of an encoder and encoding method is shown at FIG. 8. The diagram 80 shows example steps for first stage and second stage calculation. Although particular portions of the matrix 70 are shown at specific spots, this is shown for illustration purposes and those of skill in the art will recognize additional or alternative variations suitable to effectuate the invention from the disclosure herein.

The encoder may be divided into two stages. First stage encoding includes a sparse circulant calculation circuit which receives user data (u0) and multiplies it by a user matrix. For example, the user data is multiplied by matrix C 800 at the sparse calculation 802 and the result (Sc) stored in the buffer 804, while the user data is also multiplied by matrix A 806 at the sparse calculation 808 and the result (Sa) is stored in buffer 810. In the next step, encoder can start second stage calculation with the calculated data store in the buffers.

Meanwhile, next user data (u1) can continue the first stage sparse circulant calculation which is good for throughput performance. This is shown in the flowchart 90 of FIG. 9. The user data goes through the first stage calculation 900 by the sparse calculations shown at 902 as codeword 0. Codeword 0 is outputted 904 and is also used to generate codeword 1 at the second stage calculation 906, which is generated by the calculations shown at 908, 910, and 912. The parity output is then generated 914 based on at least in part codeword 0 and codeword 1.

Referring back to FIG. 8, in the second stage calculation, the first-stage data (SA) may be used to perform a sparse circulant calculation 814 with matrix E 812. Two interim data (Sc and Sae) are sent for a XOR calculation circuit 816 to yield another interim data (Sace). The dense calculation matrix F 818 is pre-calculated with $(ET^{-1}B+D)^{-1}$ and may also be programmed in the matrix memory before the encoder is enabled. Once the data (Sace) is generated, the encoder starts the dense calculation 820 with pre-calculated dense matrix F 818 to generate first portion parity data (P1). P1 is then ready to be sent as output data when available. Since the size of dense matrix F 818 is reduced, the processing latency also shortens to (n−k−k1)×(n−k−k1) iterations (See FIG. 7). Finally, the parity data (P1) is used to perform a sparse circulant calculation 824 with matrix B 822. This result is used with the first stage data Sa for an XOR calculation 826 to generate the second portion parity data/information (P2). Thus, only one calculation with the dense matrix is performed, improving the encoding speed of the memory device.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A memory system, comprising:
a memory device; and
a controller coupled with the memory device, wherein the memory device includes a memory component, and the controller is configured to:
receive information data from the memory component;

perform a first stage of encoding using a sparse circulant calculation circuit to generate first stage data;

perform a second stage of encoding to generate first portion parity information and second portion parity information;

wherein the second portion parity information is generated based at least in part on the first portion parity information and the first stage data, and wherein the second portion parity information is generated by an XOR calculation of the first portion parity information and the first stage data;

output the second portion parity information; and generate information including the second portion parity information, which contributes to improving the speed of the memory device.

2. The memory system of claim 1, wherein the first portion parity information is based at least in part on the first stage data.

3. The memory system of claim 1, wherein the controller is further suitable for generating the first stage data through at least one sparse calculation.

4. The memory system of claim 1, wherein the controller is further suitable for generating the first portion parity information through at least one sparse calculation.

5. The memory system of claim 1, wherein the first portion parity information is generated using a plurality of portions of a parity check matrix.

6. A method for operating a memory system having a memory component and a controller coupled with the memory component, the method comprising:

receiving, with the controller, information data from the memory component;

performing a first stage of encoding, with the controller, using a sparse circulant calculation circuit to generate first stage data;

performing a second stage of encoding, with the controller, to generate first portion parity information and second portion parity information;

wherein the second portion parity information is generated based at least in part on the first portion parity information and the first stage data, and wherein the second portion parity information is generated by an XOR calculation of the first portion parity information and the first stage data;

outputting the second portion parity information;

generating information including the second portion parity information, which contributes to improving the speed of the memory system.

7. The method of claim 6, the first portion parity information is based at least in part on the first stage data.

8. The method of claim 6, further comprising generating the first portion parity information through at least one sparse calculation.

9. The method of claim 6, further comprising generating the first stage data through at least one sparse calculation.

10. The method of claim 6, wherein the first portion parity information is generated using a plurality of portions of a parity check matrix.

11. A memory device, comprising:

a memory component; and a controller coupled with the memory component and configured to:

receive information data from the memory component;

perform a first stage of encoding using a sparse circulant calculation circuit to generate first stage data;

perform a second stage of encoding to generate first portion parity information and second portion parity information;

wherein the second portion parity information is generated based at least in part on the first portion parity information and the first stage data, and wherein the second portion parity information is generated by an XOR calculation of the first portion parity information and the first stage data;

output the second portion parity information; and generate information including the second portion parity information, which contributes to improving the speed of the memory device.

12. The memory device of claim 11, wherein the first portion parity information is based at least in part on the first stage data.

13. The memory device of claim 11, wherein the controller is further configured to generate the first stage data through at least one sparse calculation.

14. The memory device of claim 11, wherein the controller is further configured to generate the first portion parity information through at least one sparse calculation.

15. The memory device of claim 11, wherein the first portion parity information is generated using a plurality of portions of a parity check matrix.

* * * * *